(12) United States Patent
Stochino

(10) Patent No.: US 6,219,261 B1
(45) Date of Patent: Apr. 17, 2001

(54) DIFFERENTIAL VOLTAGE-TO-CURRENT CONVERTER

(75) Inventor: Giovanni Stochino, Rome (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/557,179

(22) Filed: Apr. 21, 2000

Related U.S. Application Data

(63) Continuation of application No. PCT/IT97/00260, filed on Oct. 23, 1997.

(51) Int. Cl.[7] .............................. H02M 7/00; G05F 3/20
(52) U.S. Cl. ........................ 363/73; 323/315; 327/103
(58) Field of Search ...................................... 323/312, 313, 323/314, 315, 316; 363/73; 330/252, 256, 257; 327/103

(56) References Cited

U.S. PATENT DOCUMENTS

| | | | |
|---|---|---|---|
| 4,338,527 | 7/1982 | Nagano | 327/103 |
| 4,757,273 | 7/1988 | Bray | 330/256 |
| 4,797,629 | 1/1989 | Widlar | 330/258 |
| 5,754,039 | * 5/1998 | Nishimura | 363/73 X |
| 5,978,241 | * 1/1999 | Lee | 363/73 |

FOREIGN PATENT DOCUMENTS

| | | |
|---|---|---|
| 0 344 855 | 12/1989 | (EP). |
| 0 664 608 | 7/1995 | (EP). |
| 2 122 831 | 1/1984 | (GB). |
| 2 223 902 | 4/1990 | (GB). |

OTHER PUBLICATIONS

Patent Abstracts of Japan, vol. 095, No. 004, May 31, 1995 & JP 07 030341A (Toyota Autom Loom Works Ltd), Jan. 31, 1995.

* cited by examiner

*Primary Examiner*—Jessica Han
(74) *Attorney, Agent, or Firm*—Nixon & Vanderhye P.C

(57) ABSTRACT

In a wide dynamic range and with constant transconductance (Gm) differential voltage-to-current converter, operating in class AB, essentially comprising two complementary pairs of transistors, respectively of pnp (Q1, Q2) and npn (Q3, Q4) type, and two nominally equal resistors (RE1 and RE2), the emitters of the first pair transistors (Q1, Q2) are connected to the respective ones of dse second pair transistors (Q3, Q4) through the two resistores (E) having equal nominal resistance; a junction is provided between the emitters of the second pair transistors (Q3, Q4); and input voltages (V1 and V2) are respectively applied to the bases of first pair transistors (Q1, Q2), from collectors of which transistor output currents (I1, I2) are taken. Preferably, in this differential voltage-to-current converter, biasing and thermal balancing circuits (VP1, VP2) are connected to the first (Q1, Q3) and, respectively, to the second (Q2, Q4) transistors of said two pairs of transistors.

9 Claims, 11 Drawing Sheets

(I): unequalized
IB = 1mA
RE = 600 Ω

(II): equalized
IB = 1ma
RE = 600 Ω
IA = 40 μA
RA = 40KΩ

(I) Widlar
gmo = 1/600 Ω$^{-1}$ (II): invention
IB = 1ma
IA = 40 μA
RA = 40K Ω
gmo = 1/600 Ω$^{-1}$ gmo = 1/600 Ω⁻¹

DIFFERENTIAL VOLTAGE-TO-CURRENT CONVERTER

This is a continuation of PCT application No. PCT/IT97/00260, filed Oct. 23, 1997, the entire content of which is hereby incorporated by reference in this application.

The role of electronics of signal conditioning/processing in modern telecommunications equipment (but also in other electronic equipment) continues to grow and the need for fast and accurate analog electronics for signal processing is becoming more and more important.

Main requirements of analog part of signal conditioning/processing electronics include:

DC precision: low Vos (input offset voltage); low Ios (input offset current) and low Ib (bias current);

AC precision (Low Noise, Wide Power-Bandwidth and Low Distortion);

High speed and wide dynamic range.

Some of such requirements are in contrast with the others, which gives rise to the following problems:

it is difficult to provide simultaneously good precision and high speed;

it is difficult to provide dynamic performance which are signal level independent, due to non-linearity of critical analog parts and/or limited dynamic range, which make dynamic performance depend on signal amplitude.

Reference should be made to the annexed FIG. 1, in order to better understand these problems; this figure shows, in a digital/analog converter (DAC), an example of an application of analog conditioning techniques wherein precision and high speed are required. In this figure, the term εs in the output voltage is the static error contribution which depends on Vos, Ios, and Ib, mainly controlled by the input stage characteristics of circuit A1, while the term of dynamic error εd depends on the internal non-linearities of A1, and results within the frequency domain, in limited harmonic performance as for distortion/intermodulation, in a undesired phase modulation of frequency response and reduced power bandwidth, while in the time domain results in poor slewing/settling behaviour which can be very sensitive to signal amplitude, thus resulting in long Full-Scale Settling Times ts.

Similar reasonings apply to the natural counterpart of DACs, i.e. the Anzloo to Digital Conversion (ADC) process.

The general problem in this area can be assessed referring to the simple block diagram in the annexed FIG. 2, which highlights the first order elements that determine the dynamic performance of a generic amplifier The input stage of this amplifier is a voltage to current converter (V/I) which converts the differential input voltage Vi=(V1−V2) into the current Io, according to the relationship $I_0=(V1-V2)g_m$. We can define a static transconductance, $G_m=I_0/V_i$, as the ratio of the absolute output current Io over the input voltage Vi=V1−V2, and a differential or local transconductance as $g_m=\delta i_0/\delta V_i$, where δIo is the small change of the output current due to the corresponding small change δVi, as a function of Vi. In the ideal case $G_m=g_m(Vi=0)=g_{mo}=$Cost, but in all practical cases transconductance is a function of the input voltage Vi.

Assuming A1→∞ input-output transfer function of FIG. 2 can be written as $$\frac{V_0}{(V1-V2)} = \frac{g_m}{j\omega Co} = jf_T/f \quad (1)$$

where $f_T = g_m/2\pi Co + tm$ (2)

is the unity gain frequency.

Maximum stable frequency $f_T$(max) (that is with a phase-margin better than 45 degrees) depends on the device technology employed and on the circuit architecture.

Let us refer now to the block diagram of a feedback loop employing an operational amplifier, as shown in FIG. 3.

In this case, the first order closed loop transfer function is:

$$\frac{Vo}{Vi} = \frac{Go}{1 + jGof/f_T} \quad (3)$$

The step response is given by $$Vo(t)=V_P[1-e^{-t/\tau}] \quad (4)$$

where $V_p$ is the amplitude of output step, and $\tau=Go/2\pi f_T$

Therefore, the expression of the settling times $t_s$ within (1−γ) of the final value results in $$t_s(\gamma) = \tau \ln[1/(1-\gamma)] = \frac{GoCo}{g_m}\ln[1/(1-\gamma)] \quad (5)$$

Equation (5) clearly illustrates the important role of the input stage transconductance on settling time performance of feedback amplifiers.

Note that, assuming all parameters in equation (5) constant regardless of Vi amplitude, ts is not dependent on the step amplitude Vp.

The problem is that, while in the ideal case $g_m$ is constant over the full input voltage dynamic range, in all practical cases $g_m$ is a function of (V1−V2), therefore, according to equation (5), also ts rapidly changes with the amplitude of input voltage (it increases when decreasing $g_m$).

The result is that the complete data acquisition/processing system has to be designed for the worst case of settling time, i.e. ts(fs), which will consequently reduce system performances.

A few solutions of the above referenced problems are known, but they have several drawbacks.

A first solution is to use large value resistors for emitter (source) degeneration and to increase correspondingly the emitter (source) current IB of the differential input stage, in order to increase the dynamic range, while keeping the transconductance value constant.

However, according to such a solution, DC and AC precisions get worse and Vos, Ios and Ib, as well as the noise, are higher than in undegenerated input stages. Moreover, the dynamic range is wider, but is still limited. And the dependence of ts on voltage step Vp is still large, mainly because of mechanisms limiting the slewing/settling performance, which are typical in stages operating in class A.

A second solution is to use input stages capable of operating in class AB, in order to increase by orders of magnitude the dynamic range, output current range and amplifier slewing capability. With this solution, DC and AC precisions are slightly worse (Vos, Ios and Ib are larger and the noise is larger) with respect to conventional class A devices and, furthermore, it is hard to achieve a constant transconductance of the input stage throughout the dynamic range, while gm changes from 30% to 100% are to be expected.

A third solution is to use analog function based on current feedback architectures, which offer a good transconductance performance and very high speed. However, DC and AC precisions in this solution are poor with respect to the ones achievable with the previous techniques based on the principle of voltage feedback (larger Vos, Ios and Ib; higher noise). Moreover, DC open loop gain is usually limited to 70–90 dB, while DC open loop gain of voltage feedback architectures may extend beyond 140 dB. Such a gain limitation generally results in lower performances at low frequency and higher sensitivity to temperature, production tolerances, load changes and so on.

On the other hand, the problems already set forth find a good solution by means of the present invention, whereby an improved architecture is provided to a differential voltage-to-current converter, working in class AB, with constant transconductance and wide dynamic range.

Such a converter is characterised in that it essentially comprises two complementary pairs of transistors, respectively of pnp and npn type, and two nominally equal resistors, the emitters of the first pair transistors being connected to the respective ones of the second pair transistors through two resistors having equal nominal resistance, a junction being provided between the emitters of the second pair transistors; and in that input voltages are applied to the bases of first pair transistors, from collectors of which output currents are taken.

Advantageously, biasing and thermal balancing circuits are connected, in this converter, to the first and, respectively, to the second transistors of said two transistor pairs. More exactly, said biasing and thermal balancing circuits are connected to the first and, respectively, to the second transistors of said pairs, between bases thereof, the polarity of bases of the first pair transistors being negative with respect to the one of bases of second pair transistors.

The invention is now described in a greater detail, reference being made to the annexed drawings, wherein.

Figure 17:
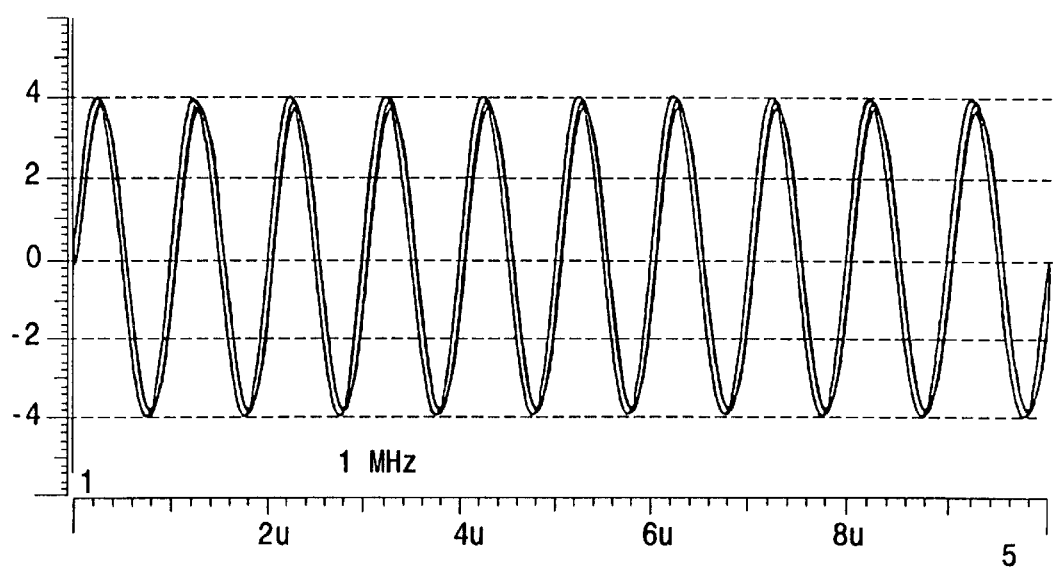

FIGS. 13 to 16 are diagrams which represent, together with the following table I, simulated normalised slewing/settling performances of different operational amplifiers using as input stages, the two first ones, respectively, a Hearn and a Widlar converter and the two last ones a converter according to the invention with equalised transconductance; and FIG. 17 is a diagram which represents, together with the following table II, simulated 1 MHz distortion (THD) performance in operational amplifiers that use different converters as input stages.

Figure 4:
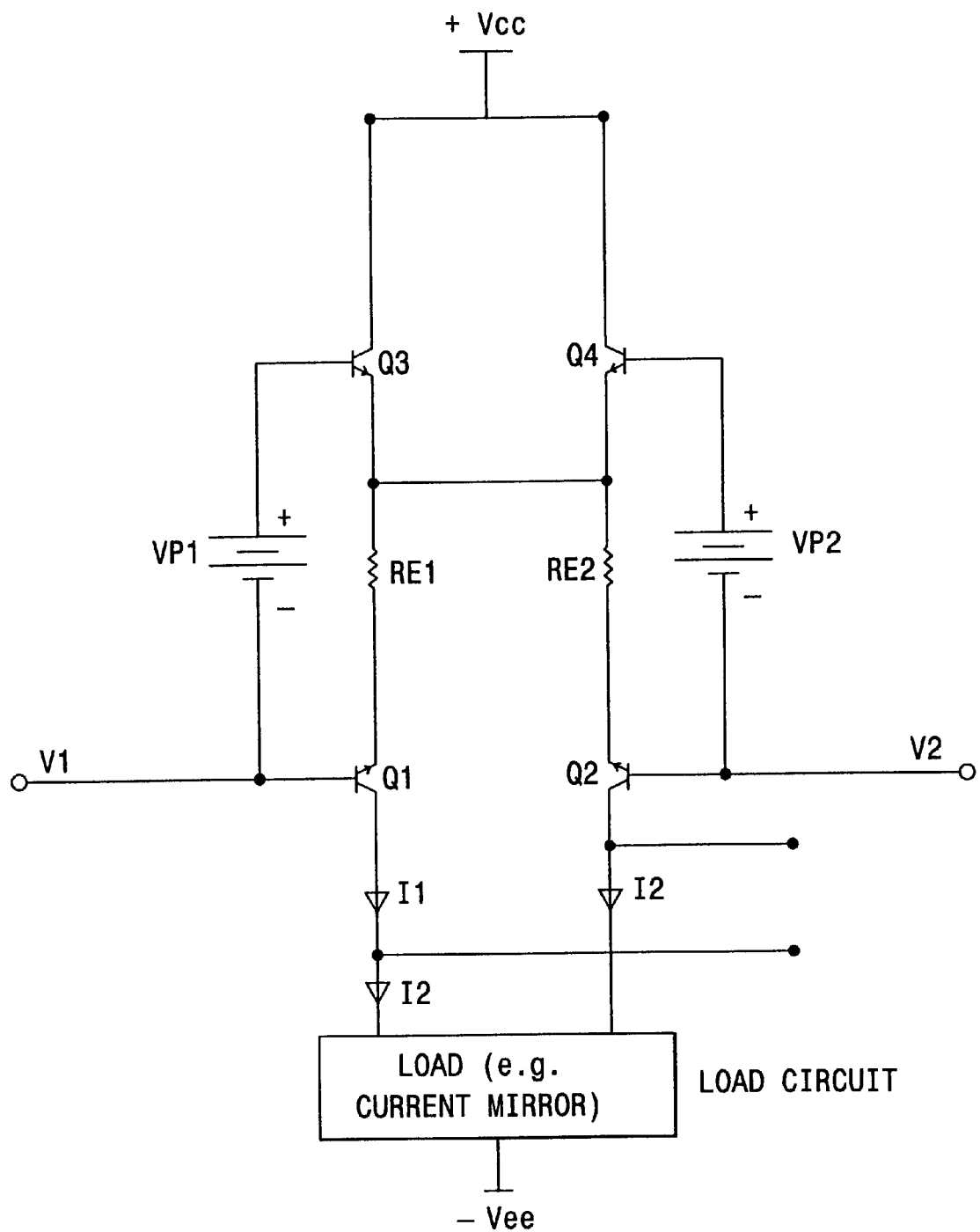
FIG. 4 show a very concise scheme of the basic architecture of the differential class; AB voltage-to-current converter, according to the invention.

As it is shown in FIG. 4, the differential voltage-to-current converter according to the invention, having a wide dynamic range and a constant transconductance (Gm; i.e. ,wherein Gm=(I1−I2)/(V1−V2)=1/RE), which operates in class AB, is substantially formed by two complementary transistor pairs, Q1, and Q2 of pnp type and Q3 and Q4 of npn type, and by two resistors RE1 and RE2, which are norminally equal. Emitters of first pair transistors Q1 and Q2 are connected to the respective ones of the second pair transistors Q3 and Q4 through the two resistors RE1 and RE2, while a junction is provided between the second pair transistors Q3 and Q4. Input voltages V1 and V2 are respectively applied to the bases of transistors Q1 and Q2 of said first pair, from collectors of which output currents I1 and I2 are taken. Biasing and thermal balancing circuits VP1 and VP2 are connected to the first transistors Q1 and Q3 and to the second transistors Q2 and Q4, respectively, of said transistor pairs, among bases thereof, the polarity of the bases of first pair transistors being negative with respect to the polarity of the bases of second pair transistors.

Figure 5:
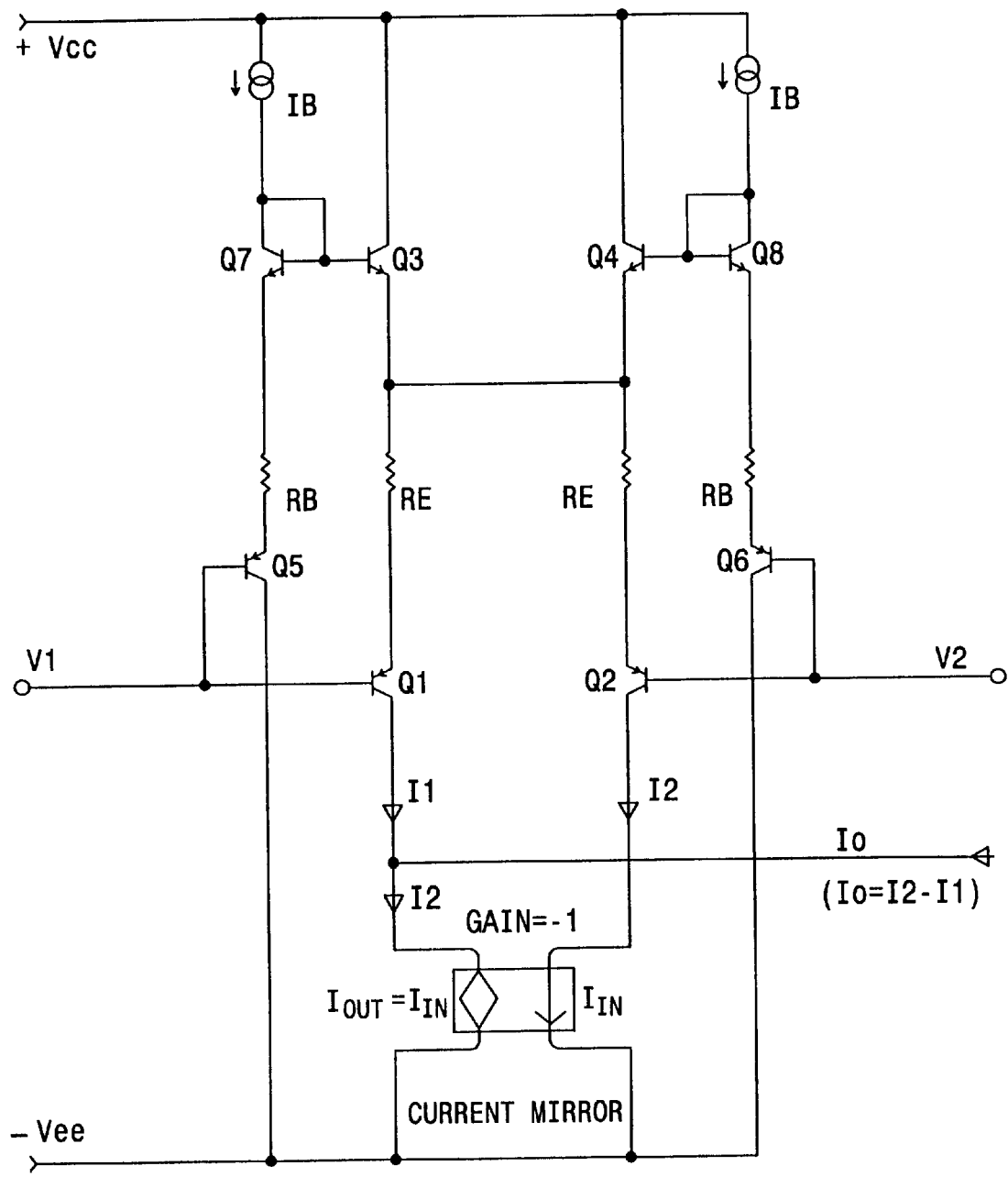
FIG. 5 is a less concise scheme of the basic architecture of the differential converter as shown in FIG. 4.

FIG. 5 provides a less concise picture of basis architecture at the differential converter of FIG. 4 according to the invention, in which figure a possible implementation of biasing and thermal balancing circuits VP1 and VP2— including transistors Q5, Q6, Q7 and Q8, two resistors RB and two current sources IB—and the converter load, formed by a current mirror circuit, is more clearly depicted. This load might be a resistive load in other applications, wherein the balanced/unbalanced conversion is not required or desired.

Figure 6:
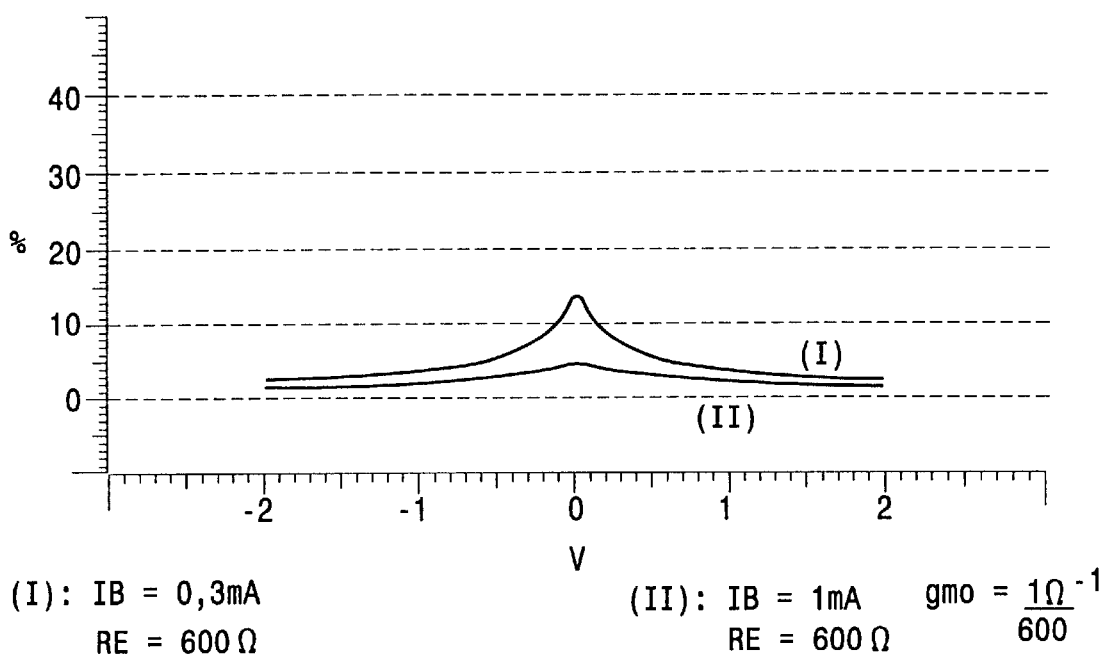
FIG. 6 is a diagram illustrating the percent transconductance deviation of the converter with constant transconductance and wide dynamic range, according to the present invention.

The nominal static/differential transconductance of the converter is gmo=1/RE. The new and characteristic feature of the converter according to the invention stems from the fact that its transconductance can be almost completely controlled by the two matched resistors RE, so that transconductance deviation from the nominal value is smoother and more reduced compared to known techniques (for instance in type Hearn and type Widlar converters). This can be appreciated in FIG. 6. The basic mechanism of voltage to current conversion in this circuit, is similar to the one of a current feedback amplifier, where transconductance is nominally defined by one or more resistors.

However, the new technique proposed with the converter above, when applied to voltage feedback configurations, allows very good slewing/settling performance, while retaining most of the other advantages of conventional voltage feedback architectures (namely DC and AC precisions and high gain at low frequency).

The main equations describing the operation of the converter are discussed in the following.

First of all, the output current is always given by $$I_o = I_1 - I_2 \quad (6)$$

both for small and large signals.

The idle situation is $$I1 = I2 = IB, \text{ and } Io = 0$$

For small signal operation, i.e. (V1−V2)<2REIB, both I1 and I2 differ from zero, that means that both halves of the converter (Q1 and Q2) contribute to the output current (whereas Q3 and Q4 are both conducting), and small signal transconductance $g_{ms}$ is given by:

$$g_{ms} = \frac{2}{[2r_{es} + 2R_E]} = \frac{1}{[r_{es} + R_E]} \leq g_{mo} \quad (7)$$

where $r_{es} = V_T/I_B$ is the emitter resistance, $V_T = kT/q$ is the thermal voltage (approximately 25 mV at 290 K) and $g_{mo} = 1/R_E$ is the nominal transconductance.

During large signal operation, i.e. (V1−V2)>>2RE IB, only one half at a time conducts, Q1+Q4 or Q2+Q3, depending on the polarity of the input voltage, so that I1 or I2 is zero.

Large signal transconductance $g_{ml}$ is then given by $$g_{ml} = \frac{1}{[r_{el} + R_E]} \quad (8)$$

where $r_{el} = V_T/I_c$ is the emitter resistance of the conducting transistor pair, corresponding to the instantaneous emitter current Ie. Of course $r_{el} < r_{es}$.

Choosing circuit parameters and biasing current such that $$R_E >> r_{es} \text{ or } I_B >> V_T/R_E \quad (9)$$

voltage to current conversion ratio is the same both for small and large signals, i.e.

$$g_{ms} = g_{ml} \approx 1/R_E \cong g_{mo} \quad (10)$$

The output dynamic range of the converter is defined by the maximum available current Io (max), which is controlled by the available driving current IB for Q1 and Q4, and by current gain βn of npn transistors by the equation |Io(max)|=IB βn. This translates into the equivalent input voltage dynamic range given by Vi(max)−Vi(min)=2IBβnRE. Example: IB=0.3 mA, βn=100, RE=600 Ω: then Io(max)=30mA and Vi(max)−Vi(min)=36%.

In practice the input voltage range is limited by the base-emitter breakdown voltage of input transistors, which is in the range of 3–10 Volts, depending on device technology.

Since the transconductance of the proposed solution is substantially constant over a very wide dynamic range, either of the following benefits can be achieved:

with the same discrete/IC technology (i.e. same process fT), digital parts of signal processing systems can be operated at higher clock frequency than other techniques (1.5 to 3 times higher), for better performances at the same cost;

alternatively, the same overall performances as with the known solutions can be attained with a less expensive discrete/IC technology.

These features are particularly important for the implementation of signal processing systems in mixed (digital and analog) VLSI technologies, in order to reduce cost and size of the microcircuit (silicon) and/or improve system performance.

The reasons of such advantages depend:

on a reduced deviation of the local and the static transconductance from the nominal value, in a large portion of the dynamic range (when properly applied, the residue of unequalisation can be as low as few percent);

on the fact that the technique offers a high degree of flexibility (biasing currents and transconductance values can be set, to some extent, independently, the one from the other).

on the fact that transconductance value and converter dynamic capability (large signal frequency response and speed) can be optimised without interactions the one with the other.

Some measures can be adopted, in order to further improve the features of the inventive converter, so as to improve its performances, in view of transconductance deviation (equalisation techniques).

Let us the consider that the absolute deviation of actual transconductance of the new proposed V/I technique, from the nominal value, is given by $$\delta(g) = \frac{g_m - g_{mo}}{g_{mo}} \leq \frac{1}{1 + R_E I_B / V_T} \quad (11)$$

which is monotonic and has its maximum value when V1−V2=0.

In order to meet system requirements, deviation δ(g) must be normally limited to δ≦δo, so the following relation has to be met:

$$I_B \geq \frac{V_T}{R_E}\left(\frac{1}{\delta o} - 1\right) \quad (12)$$

For example, when RE=600 Ω and δo=5%. Equation (12) yields IB>0.8 mA.

In very high speed applications, the requirements of equation (12) on the biasing current of the converter, in order to confine transconductance deviation within the desired value are not a big problem, since high current density in the input stage and low level of system impedance are usually the rule to ensure wide bandwidth and signal integrity. In medium-high impedance applications, however, the errors reflected to the inputs of high biasing currents, Ib=IB/β, are generally high and not acceptable and therefore have to be reduced. An effective means can be represented by the use of input voltage followers which drive the bases of transistors Q1 and Q2. This will worsen, however, the input offset voltage which should be taken into account during design stage. Alternatively, there are some equalisation techniques, which permit to significantly reduce the biasing current, while keeping the transconductance deviations within the required levels, over the full dynamic range and without essentially degrading offset voltage.

These techniques are part of this invention and are disclosed according to three embodiments in the following.

As mentioned above, FIGS. 7, 10 and 11 are different versions of the scheme of basic architecture of the converter according to the invention.

Figure 7:
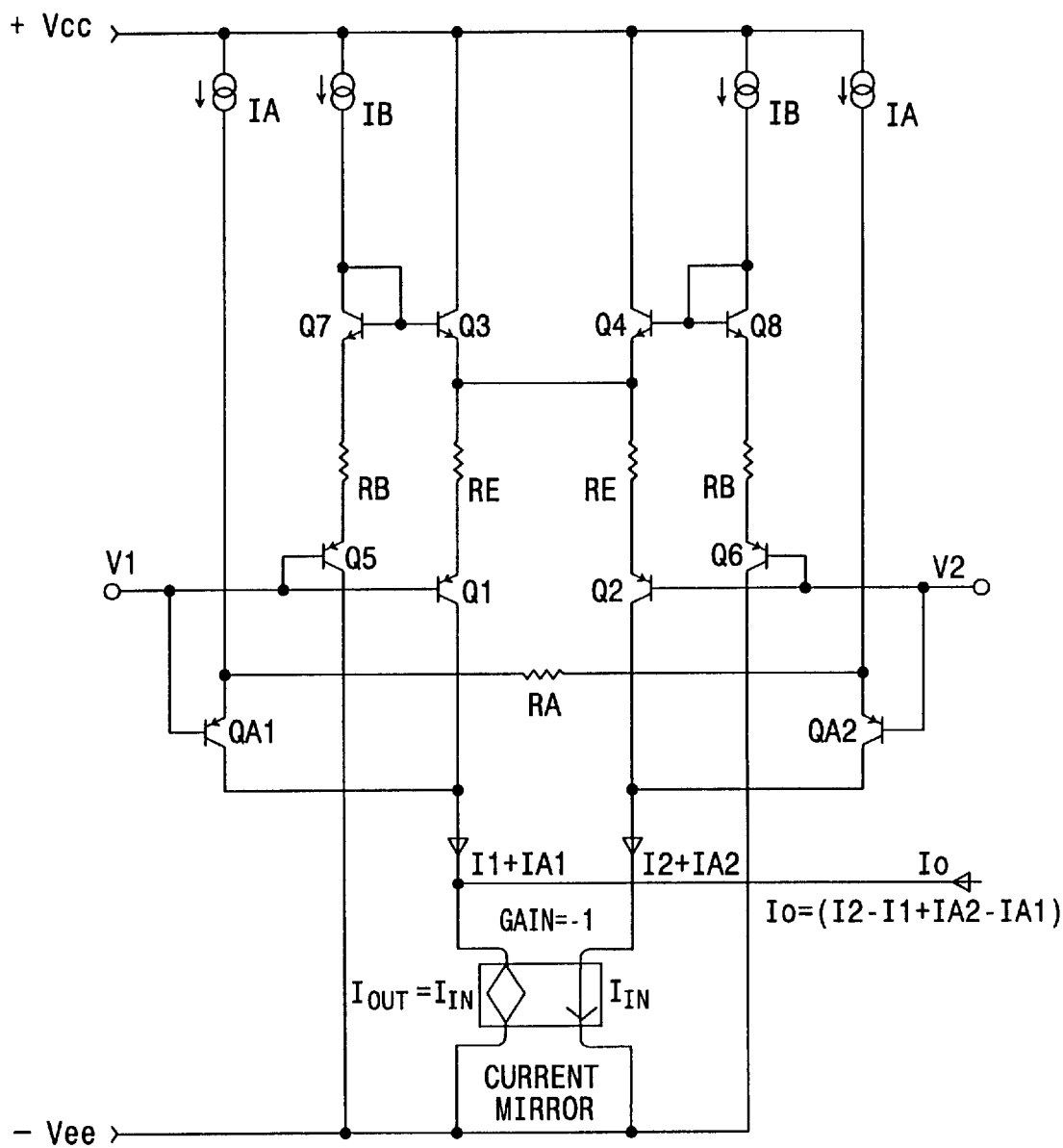
FIG. 7 is a scheme of architecture of a first alternative version of the differential voltage-to-current converter according to the invention, wherein techniques of transconductance equalisation have been introduced.
Figure 10:
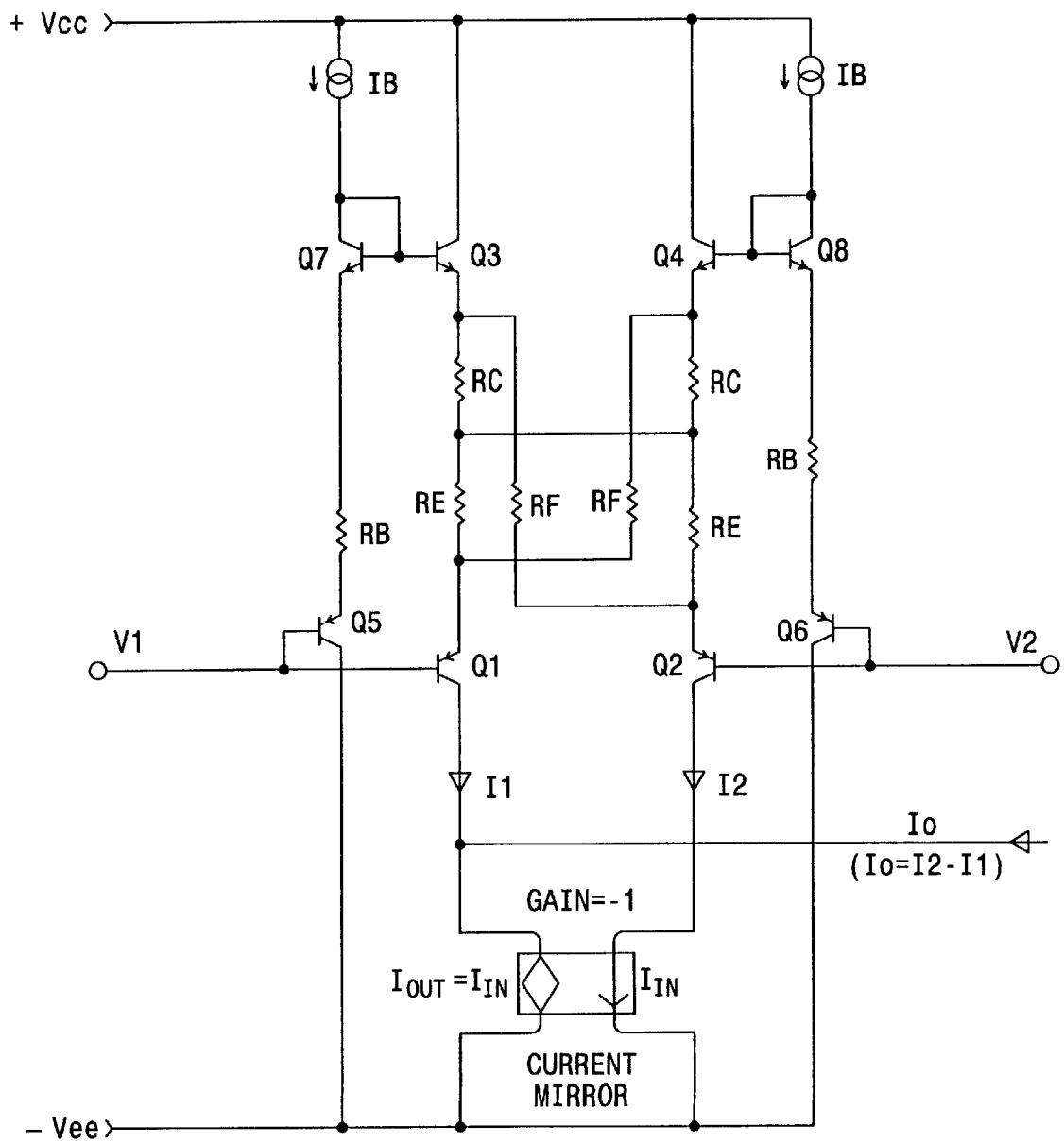
FIG. 10 is a scheme of architecture of a further version of the differential voltage-to-current converter according to the invention, wherein transconductance equalisation techniques are applied.

FIG. 7 and FIG. 10 are feedforward error correction techniques, and therefore do not add any frequency stability issue to the circuit.

Figure 11:
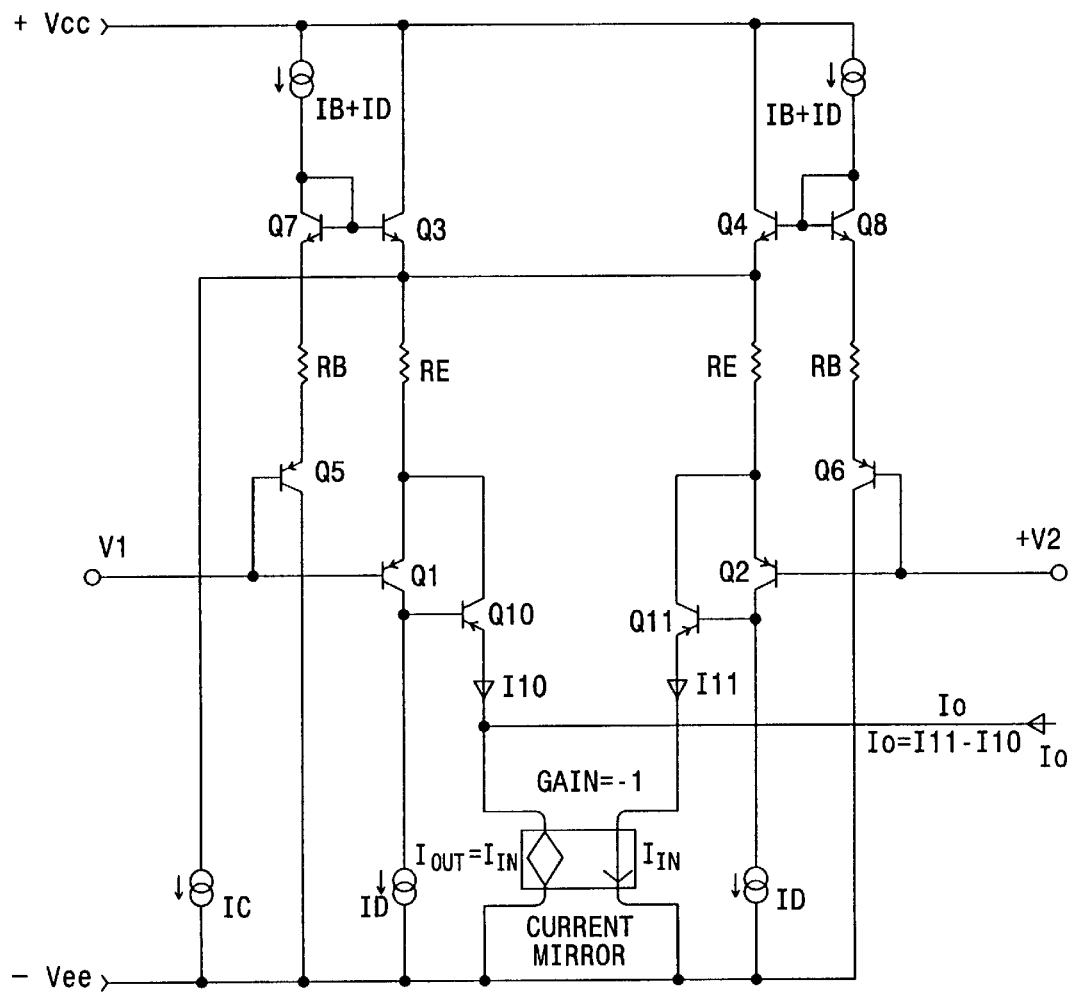
FIG. 11 is a scheme of architecture of a still further version of the differential voltage-to-current converter according to the invention, wherein transconductance equalisation techniques are applied.

FIG. 11 is a feedback error correction technique, very effective, but it can give rise to problems of frequency stability when the feedback factor of the amplifier is too high. Therefore the latter technique is mainly intended for closed loop application with high gain.

In the case of FIG. 7 solution, the transistors QA1, QA2 and the resistor RA, together with current sources IA, form an auxiliary voltage-to-current converter, which provides additional current to the output, to counterbalance, to a certain extent, the error of the main converter in the central region only (Vi close to zero), where deviation is higher. In principle, the nominal transconductance gma of the auxiliary converter, controlled by R,A and IA, should be equal to the absolute deviation of the main converter at V1−V2=0, i.e.

$$g_{ma} = g_m [Vi=0] - g_{mo} \quad (13)$$

It should also tend to zero when V1−V2>RA IA, so that large signal transconductance, which is inherently close to gmo, is not affected by the auxiliary converter. Equation (13) can be rewritten as $$\frac{2}{2r_{eA} + RA} = \frac{r_{es}}{R_E[r_{es} + R_E]} \quad (14)$$

and then $$2r_{eA} + R_A = 2R_E[1 + R_E I_B/V_T] \quad (15)$$

where $r_{eA} = V_T/I_A$

Example: when RE=600 Ω and IB=0.2mA; equation (15) gives $$2r_{eA} + R_A = 2RE [1 + R_E I_B/V_T] = 6960 \ \Omega$$

Figure 8:
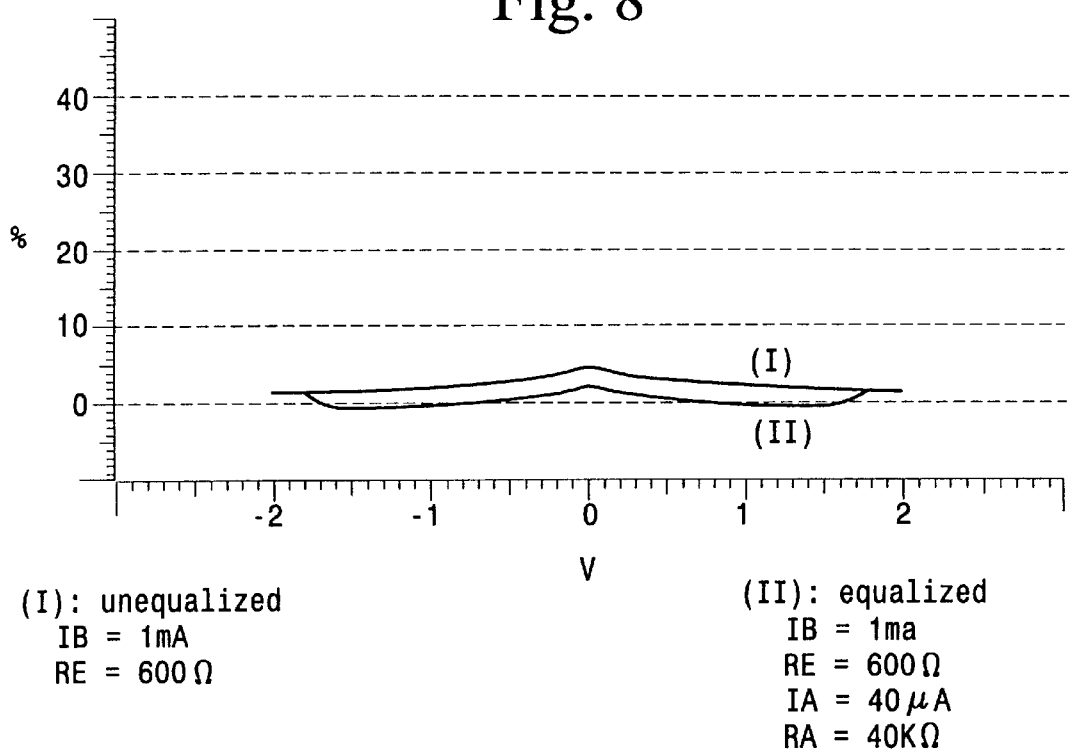
FIG. 8 is a diagram relating to transconductance percent deviation of the converter according to the invention, before and after equalisation.
Figure 9:
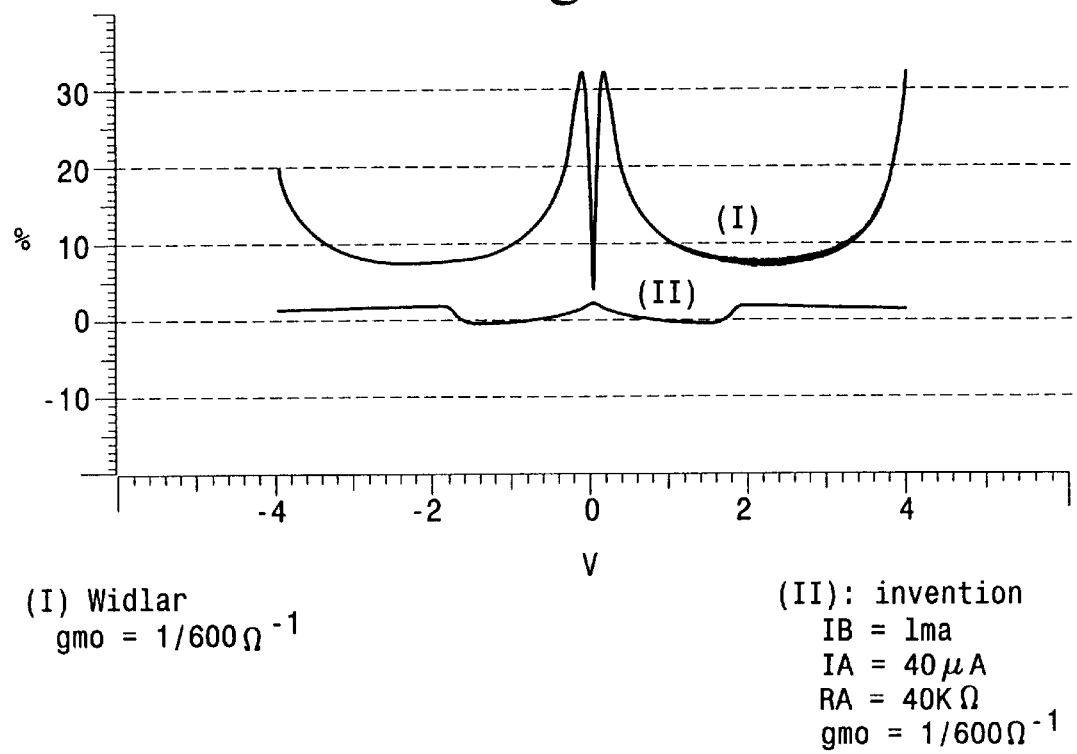
FIG. 9 is a diagram relating to transconductance percent deviation of the converter according to the invention after equalisation and as compared to the deviation in a type Widlar converter, having the same nominal transconductance in a range of input voltages from −4 to +4 Volts.

The available design parameters are two, RA and IA. Therefore, they can be set in such a way as to simultaneously meet equation (15) and achieve the best equalisation in the range of interest. Peak deviation by less than 5% can be normally achieved with currents up to 4 times less than the lower bound placed by equation (12), in the entire dynamic range, as shown in FIG. 8. In FIG. 9 a comparison of the extended range performance of a new V/I converter (curve II) with a Widlar converter (curve I) is shown in the input range −4 to +4 Volt, which demonstrates the benefits of the new technique in terms of reduced percent peak deviation (2% against 32%).

Note that bases of transistors QA1 and QA2, as well as the input of the converter as shown in FIG. 7, can be connected to the emitters of Q5 and Q6, respectively, in order to reduce input biasing current IB. However, offset voltage will be again slightly worsened.

According to the solution of FIG. 10, equalsation is achieved by means of extra resistors RC and RF, which help to increase transconductance under the condition V1−V2=0. Unfortunately, large signal transconductance is also affected, so resistors RE, RC (low value) and RF have to be adjusted for the best match of full scale transconductance. Although effective in terms of component number and current consumption, this technique has the drawbacks to need resistors with a matched low value, which is difficult to achieve in IC technology, and to provide expectedly higher offset voltage.

When considering the solution of FIG. 11, it may be noted that the transconductance equalisation technique based on the feedback error correction principle can be applied with very effective results to the converter of this invention, in order to achieve a very small gm deviation in a wide input voltage range.

To this purpose two extra transistors Q10 and Q11 are cascaded to Q1 and Q2, respectively in the version of FIG. 11, in order to increase the available open loop gain.

Local feedback is then applied by connecting the collectors of Q10 and Q11 with the emitters of Q1 and Q2, as shown in FIG. 11, in order to achieve high transconductance with low emitter current. The output of the converter consists of the emitter currents of transistors Q10 and Q11. This technique provides a small signal transconductance equal to $$g_{mf} = \frac{2}{[2r_{ef} + 2R_E]} \cong \frac{1}{R_E} \quad (16)$$

in the whole class A range −RE IB<(V1 −V2)<RE IB, $$\text{since } r_{ef} = V_T/\beta_n I_B >> R_E \quad (17)$$

even for currents as low as 10 μA, for usual values of current gain of npn transistor (βn>150).

Figure 12:
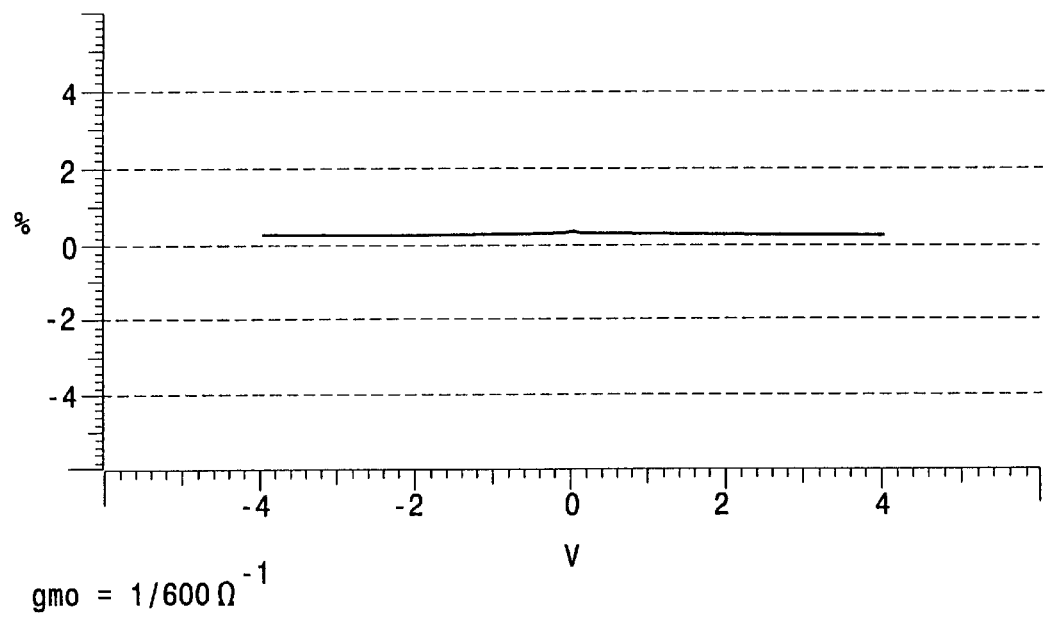
FIG. 12 is a diagram relating to the transconductance percent deviation of the converter according to the invention, taken in reference with its embodiment of FIG. 11.
Figure 13:
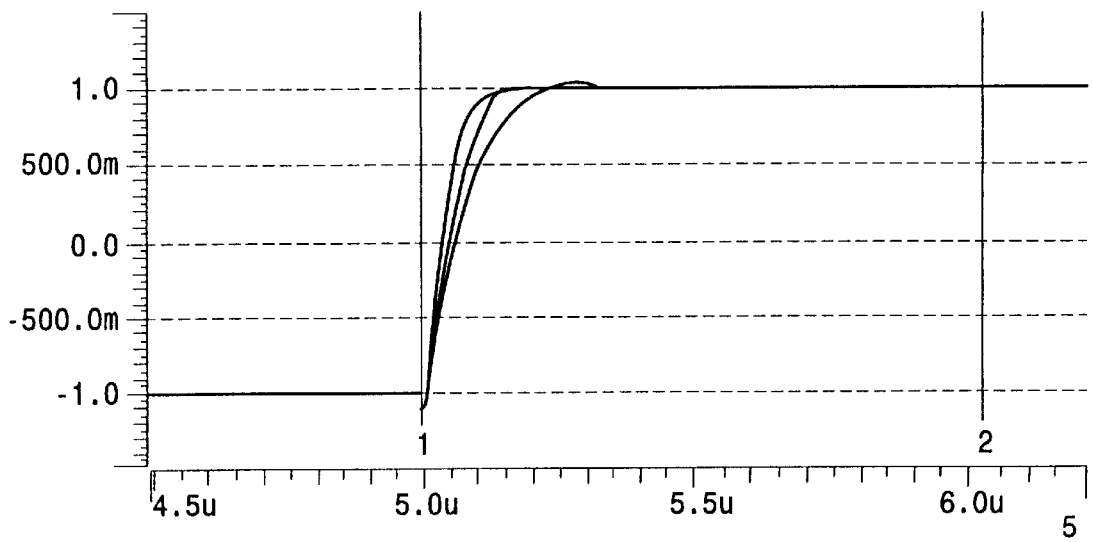
Figure 14:
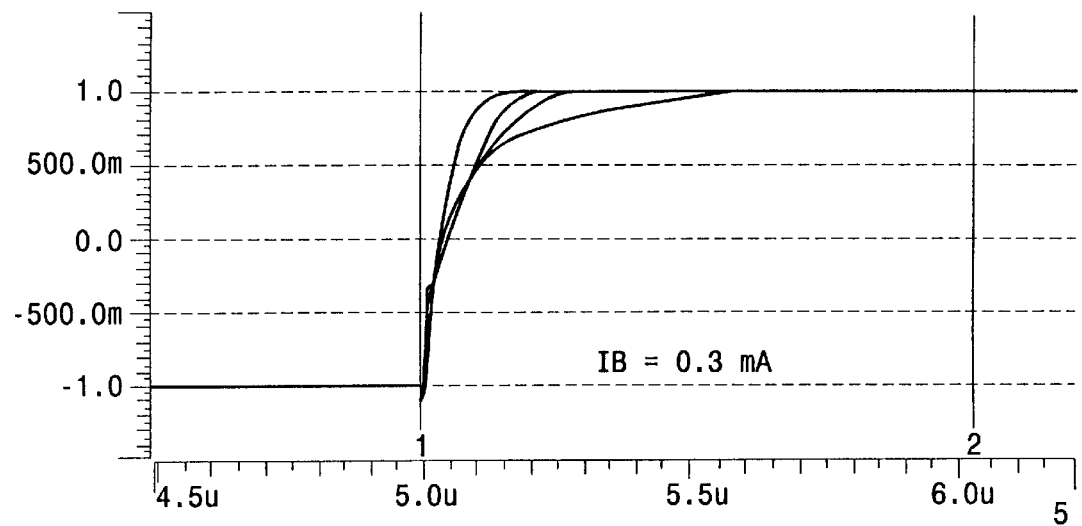
Figure 15:
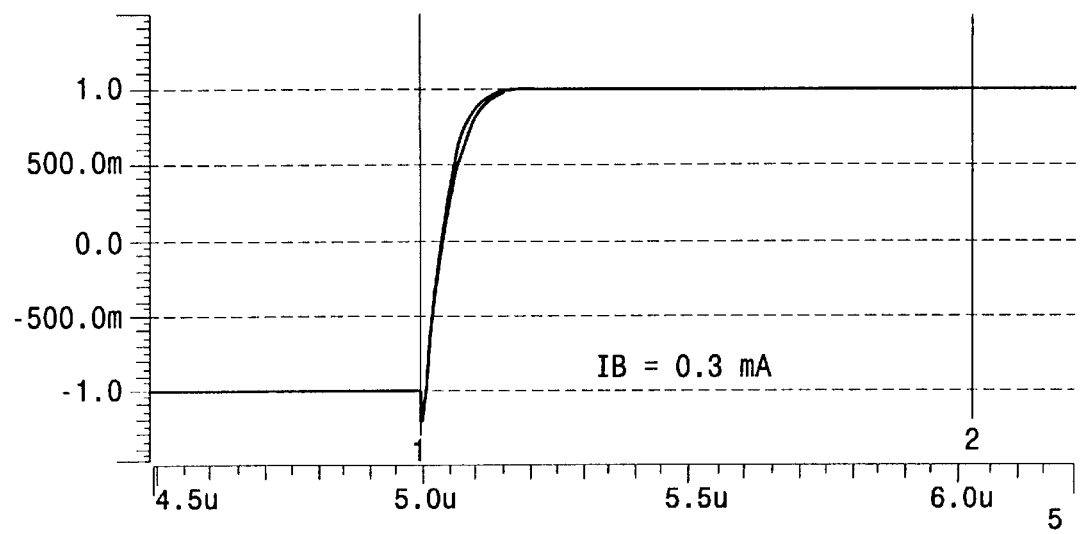
Figure 16:
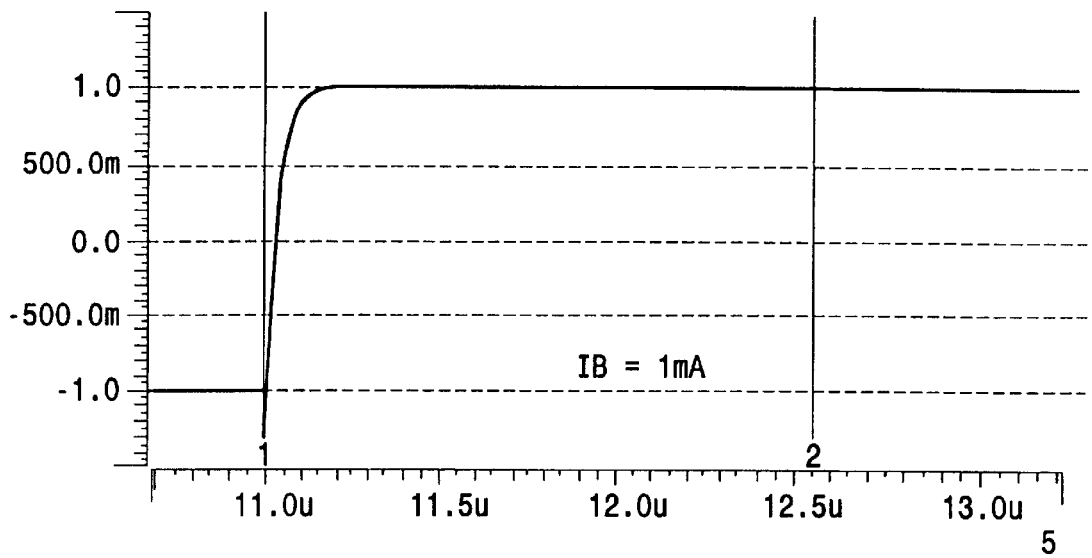

In order to achieve the lowest deviation from the nominal transconductance, transistors Q3 and Q4, which do not contribute to small signal performances of the converter, can be suitably biased, via the current generator IC. This current, which due to circuit configuration does not reflect any appreciable error contribution to the input, helps to attain very low full range deviations of gm from the nominal value, typically less than 1% as shown in FIG. 12.

The same technique of high accuracy voltage to current conversion depicted in FIGS. 4 and 5 can be implemented in different ways without leaving the scope of the invention, for instance by using a complete complementary version of the V/I scheme depicted in FIG. 5 where npn and pnp transistors are interchanged, together with circuit polarity reported in FIGS. 4 and 5, or by using different active devices in the same basic architecture or by the same converter core, but with different biasing techniques.

Figure 1:
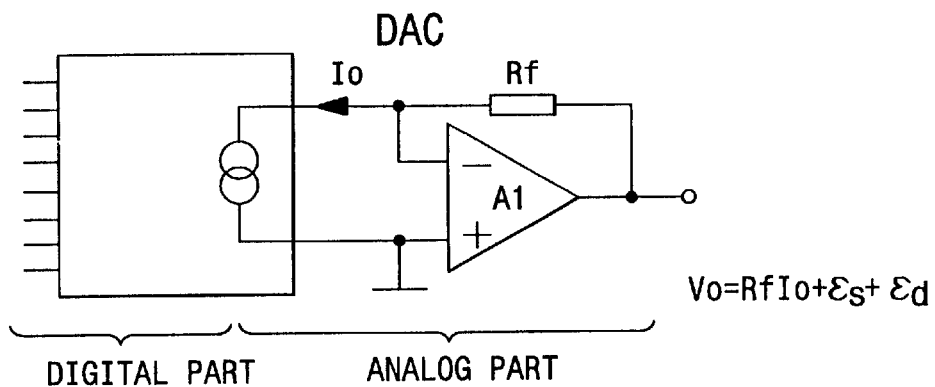
FIG. 1 shows an embodiment of analog electronics for precision, high speed signal-conditioning.
Figure 2:
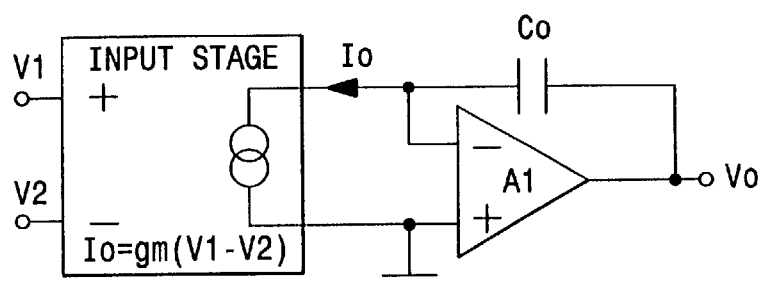
FIGS. 2 and 3 show the block diagrams, respectively of a general amplifier and of a feedback circuit employing an operational amplifier, to which reference has been made in the: above disclosure in order to describe the inventive problem.
Figure 3:
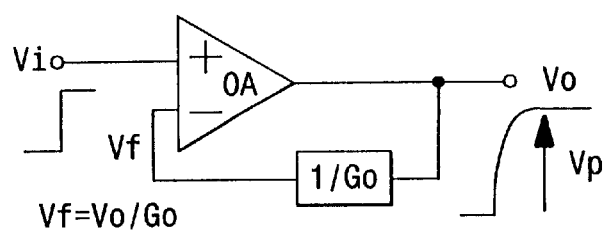

The advantages of the present invention can be assessed by means of a comparison with the prior art. Let us, for instance, take into consideration the simple application case of the feedback amplifier of FIG. 3, with Go=2, incorporating the operational amplifier architecture shown in FIG. 2. Hearn, Widlar and the inventive V/I converter, are alternatively used in the input stages of the operational amplifier, and their respective SPICE simulated performances (1% settling time and high frequency total harmonic distortion, THD, at f=1MHz, Vo=8V peak to peak) are compared and assessed.

In order to make the comparison meaningful, all stages following the input of the voltage to current converter are ideal controlled sources. Moreover, nominal input transconductance and unity gain frequency of the amplifier are the same for all designs. The nominal input stage transconductance is set to $g_{mo}=1/600 \ \Omega^{-1}$, the unity gain frequency is fT=8.6 MHz (Co=30pF) and phase-margin is >60° for all implementations, so that nominal settling time to 1% is $t_s=166$ ns.

Simulation results are reported in FIGS. 13 to 16, where the normalised step responses for Hearn's, Widlar's and inventive amplifier, respectively, are shown superposed for an input voltage amplitude ranging from 10 mV (peak) to 4 V (peak). FIG. 17 shows the distortion performance of converters at f=1 MHz and Vo=8 V (peak-peak).

Settling time and high frequency THD performances of the amplifiers are summarised on Table 1 and Table 2, respectively.

TABLE 1

SETTLING TIME PERFORMANCE (SPICE SIMULATION)

| TECHNIQUE | Nominal Settling time (1%) | Simulated Settling Time Range for Vi (peak) = 10 mV, 200 mV, 1 V and 4 V | Percent Variation |
|---|---|---|---|
| HEARN (IB = 0.3 mA) | 166 ns | 157 ns–307 ns | −5%/+84% |
| WIDLAR | 166 ns | 157 ns–547 ns | −5%/+229% |
| INVENTION (IB = 1 mA) | 166 ns | 152 ns–167 ns | −8%/+0.6% |
| INVENTION (IB = 0.3 mA) | 166 ns | 151 ns–187 ns | −9%/+12% |

TABLE 2

HIGH FREQUENCY TOTAL HARMONIC DISTORTION (THD) PERFORMANCE

| TECHNIQUE | Closed loop gain | Output Voltage Frequency | THD (%) |
|---|---|---|---|
| HEARN (IB = 0.3 mA) | 2 | 8 V (peak-peak)-1 MHz | 1.8% |
| WIDLAR | 2 | 8 V (peak-peak)-1 MHz | 4.4% |
| INVENTION (IB = 1 mA) | 2 | 8 V (peak-peak)-1 MHz | 0.35% |
| INVENTION (IB = 0.3 mA) | 2 | 8 V (peak-peak)-1 MHz | 0.42% |

It can be easily appreciated that the inventive technique provided much better performances both for full scale settling time, which is less sensitive to voltage change than the other known similar techniques (in FIG. 17 we can appreciate the fact that the step responses from 10 mV (peak) to 4 V (peak) are perfectly superposed one to another, which demonstrates the good full range linearity of the converter), and for high frequency THD performance (which are superior to the other techniques by almost and order of magnitude).

What is claimed is:

1. Wide dynamic range differential voltage-to-current converter with constant transconductance (Gm), in combination with enhanced precision operating in class AB comprises:

two complementary pairs of transistors, respectively of pnp and npn type, and only two nominally equal resistors;

the emitters of the first pair transistors are connected to the respective ones of the second pair transistors through the two resistors having equal nominal resistance;

a junction is provided between the emitters of the second pair transistors; and wherein input voltages are respectively applied to the bases of first pair transistors, from collectors of which output currents are taken.

2. Differential voltage-to-current converter as set forth in claim 1, wherein biasing and thermal balancing circuits are connected to the first and, respectively, to the second transistors of said two pairs of transistors.

3. Differential voltage-to-current converter as set forth in claim 2, wherein said biasing and thermal balancing circuits are connected between the bases of the first and, respectively, the second transistors of said pairs, the polarity of bases of the first pair transistors being negative with respect to the one of bases of second pair transistors.

4. Converter as set forth in claim 1, wherein each biasing and thermal balancing circuit comprises a transistor pair and, respectively), a resistor and a current source.

5. Converter as set forth in claim 1, the outputs of which are the currents from the collectors of the first pair transistors which are channeled towards the load circuit, including a current mirror circuit.

6. Converter as set forth in claim 1, the outputs of which are the currents from the collectors of the first pair transistors which are channeled towards the load circuit including a resistive network.

7. Converter as set forth in claim 1, further comprising, for equalization purposes, an auxiliary voltage-to-current converter including a third transistor pair, a resistor connecting the emitters of said third transistors and two biasing current sources connected to the emitters of said third pair transistors.

8. Converter as set forth in claim 1, wherein, for equalization purposes, two pairs of additional resistors are provided, which are respectively cascaded to the resistors connecting said first and second transistors pairs and which connect the emitters of oppositely crosswise arranged transistors of said pairs.

9. Converter as set forth in claim 1, wherein, for equalization purposes, two additional transistors are cascaded to the transistors of said first pair having their own collectors connected to the emitters of the transistors of said first pair, a current source being further provided to bias the transistors of said second pair.

* * * * *